United States Patent
Kornmeyer

(10) Patent No.: US 10,151,030 B2
(45) Date of Patent: Dec. 11, 2018

(54) PROTECTIVE LAYER FOR PECVD GRAPHITE BOATS

(71) Applicant: KGT GRAPHIT TECHNOLOGIE GMBH, Windhagen (DE)

(72) Inventor: Torsten Kornmeyer, Konigswinter (DE)

(73) Assignee: KGT GRAPHIT TECHNOLOGIE GMBH, Windhagen (DE)

( * ) Notice: Subject to any disclaimer, the term of this patent is extended or adjusted under 35 U.S.C. 154(b) by 83 days.

(21) Appl. No.: 15/116,849

(22) PCT Filed: Feb. 4, 2015

(86) PCT No.: PCT/EP2015/052255
§ 371 (c)(1),
(2) Date: Aug. 5, 2016

(87) PCT Pub. No.: WO2015/117991
PCT Pub. Date: Aug. 13, 2015

(65) Prior Publication Data
US 2017/0211182 A1 Jul. 27, 2017

(30) Foreign Application Priority Data
Feb. 6, 2014 (DE) .................. 10 2014 101 497

(51) Int. Cl.
| | |
|---|---|
| *H01L 21/67* | (2006.01) |
| *C23C 16/458* | (2006.01) |
| *H01L 21/673* | (2006.01) |
| *C23C 16/32* | (2006.01) |
| *C23C 16/34* | (2006.01) |
| *C23C 16/50* | (2006.01) |

(52) U.S. Cl.
CPC .......... *C23C 16/4581* (2013.01); *C23C 16/32* (2013.01); *C23C 16/34* (2013.01); *C23C 16/50* (2013.01); *H01L 21/67306* (2013.01)

(58) Field of Classification Search
USPC ............. 118/726, 728; 156/345.23; 428/336, 428/698, 704
See application file for complete search history.

(56) References Cited

U.S. PATENT DOCUMENTS

| | | | |
|---|---|---|---|
| 5,536,574 A * | 7/1996 | Carter ................... | C04B 41/009 428/704 |
| 6,120,640 A * | 9/2000 | Shih ...................... | C23C 28/044 118/728 |
| 2007/0221132 A1* | 9/2007 | Chandran ........... | C23C 16/4581 118/728 |
| 2008/0050522 A1 | 2/2008 | Yang et al. | |
| 2008/0141938 A1* | 6/2008 | Chandran ............... | C04B 35/44 118/723 E |
| 2008/0292812 A1* | 11/2008 | Ramm .................. | C23C 14/325 118/50 |
| 2009/0133628 A1 | 5/2009 | Dahl et al. | |
| 2009/0155028 A1 | 6/2009 | Boguslavskiy | |
| 2012/0278443 A1 | 11/2012 | Taniuchi et al. | |
| 2012/0279443 A1 | 11/2012 | Kornmeyer | |
| 2013/0302616 A1 | 11/2013 | Kano | |

FOREIGN PATENT DOCUMENTS

| | | | |
|---|---|---|---|
| CN | 101897003 A | | 11/2010 |
| EP | 0143479 A1 | | 6/1985 |
| EP | 2053649 A2 | | 4/2009 |
| JP | 62-176981 | * | 8/1987 |
| JP | 11-0279761 | * | 10/1999 |
| JP | 2000-086374 | * | 3/2000 |
| WO | 2002020871 A1 | | 3/2002 |

OTHER PUBLICATIONS

International Search Report issued in PCT/EP2015/052255, dated Mar. 17, 2015.

* cited by examiner

*Primary Examiner* — Archene A Turner
(74) *Attorney, Agent, or Firm* — Heslin Rothenberg Farley & Mesiti P.C.

(57) ABSTRACT

An improved protective layer is provided for PECVD graphite boats for receiving wafers and for transporting the wafers in or through PECVD coating systems, in particular in the photovoltaics industry. A more homogeneous antireflection layer on silicon substrates is achieved by virtue of the PECVD boat of graphite being provided with an electrically conductive hard material coating of at least boron carbide ($B_4C$).

7 Claims, No Drawings

PROTECTIVE LAYER FOR PECVD GRAPHITE BOATS

CROSS REFERENCE TO RELATED APPLICATIONS

This application is the National Phase filing under 35 U.S.C. § 371 of PCT International Application No. PCT/EP2015/052255, filed Feb. 4, 2015, and published as WO 2015/117991 A1 on Aug. 13, 2015, which claims priority to German Application No. 102014101497.9, filed Feb. 6, 2014. The contents of each of the prior applications are hereby incorporated by reference herein in their entirety.

BACKGROUND ART

The invention relates to a protective layer for PECVD boats made of graphite for receiving wafers and for transporting same in or through PECVD coating plants, in particular in the photovoltaics industry.

PECVD (plasma enhanced chemical vapor deposition) refers to coating of surfaces with the aid of a plasma.

PECVD boats, also known as wafer boats, are usually composed of graphite and are used to safely receive as many wafers made of glass, silicon or other materials suitable for manufacture of solar cells as possible so that safe handling and storage of the laden wafer boats without risk of damage to the wafers is possible. To this end the wafer boats must be provided with suitable retaining means, such as wafer pockets or retaining pins. The individual wafers in the wafer boat must moreover be held spaced apart to allow a flow of gases through all interspaces between the wafers that is as uniform as possible.

In addition, in the interests of a uniform coating the PECVD boats must not impede the formation of a plasma between the individual wafers.

DE 10 2008 019 023 A1 discloses a continuous-flow vacuum plant for processing substrates by means of PECVD and also a plasma boat (wafer boat) for receiving and for transporting wafers through the continuous-flow vacuum plant.

To also allow formation of a plasma between the wafers during the coating procedure, either intermediate carriers made of a conductive material, such as graphite, which together with a suitable alternating voltage supply act as antennae, are provided or the wafer boat as a whole is composed of graphite.

A solar cell (Si substrate) furthermore needs to have an antireflective layer applied to it with a suitable plasma CVD plant in order to achieve the best possible efficiency. This is usually effected by application of a silicon nitride or oxide layer onto the surface of the substrate by means of a PECVD process.

Details of such a rather complicated process are disclosed in DE 10 2012 101 456 A1.

In order then to achieve the most homogeneous possible antireflective coating of silicon nitride on the Si substrate it is customary to first provide the PECVD boats with a comparatively thick silicon nitride coating having a layer thickness of about 1 µm. This requires exposing the PECVD boats in an oven at a temperature in excess of 480° C. to an atmosphere comprising silane ($SiH_4$) and ammonia ($NH_3$) as is described for instance in WO 03/025248 A1 using the example of depositing silicon nitride on a substrate.

When PECVD boats without such a silicon nitride coating are used it has been found that a sufficiently homogeneous antireflective coating cannot be produced. The reason for this is that the difference in electrical surface resistance/conductivity between the graphite of the wafer boat and the silicon of the silicon substrate is too great.

What is problematic and costly here is that after 40 to 100 coating processes it is necessary to etch back the silicon nitride coating on the PECVD boat by means of HF (hydrofluoric acid) wet etching with addition of oxygen and to subsequently reapply the coating.

This means that regular coating of the PECVD boats entails additional complexity and thus additional costs which simultaneously results in an 8-10% reduction in the availability of the production plants for producing the antireflective coating, i.e. of the PECVD plant, since the silicon nitride coating is performed in the same PECVD plant as the antireflective coating. This results in increased wafer costs.

Also, additional wear arises during the etching back of the PECVD boats due to the oxygen. A further disadvantage is that the PECVD boats having a silicon nitride coating have no oxygen-resistant protective layer behind the silicon substrate.

BRIEF SUMMARY OF THE INVENTION

The invention, then, has for its object to provide a protective layer for PECVD boats which does not suffer the disadvantages described and which simultaneously makes it possible to produce a better and more homogeneous antireflective layer on silicon substrates.

It has been found that, surprisingly, the object of the present invention can be achieved simply by covering the PECVD boat composed of graphite or carbon with an electrically conductive hard-material coating.

DETAILED DESCRIPTION

Hard-material coatings composed of titanium nitride (TiN), boron carbide ($B_4C$) or else silicon carbide (SiC), with which particularly dense coatings may be produced, have proven especially suitable.

The total layer thickness of the coating should be between 0.1 µm and 5 µm.

In a further embodiment of the invention the hard-material coating may be composed of a combination of titanium nitride, titanium carbide and boron carbide.

Alternatively the hard-material coating may have a multilayer construction, composed of titanium nitride and/or titanium carbide and/or boron carbide. Up to about 20 of these layers may be arranged one above the other.

With such a coating the particularly good or at least improved electrical conductivity of the surface of the PECVD boats achieves a particularly uniform formation of the plasma, in particular also between the wafers, and the antireflective coating of silicon nitride to be produced on the wafers therefore exhibits markedly improved homogeneity.

Even when the PECVD boats configured in accordance with the invention are exposed to other processes comprising oxygen or nitrous oxide the hard-material coating according to the invention exhibits particularly good durability.

In particular, the hard-material coating according to the invention is particularly etch-resistant and said coating is therefore not attacked during the necessary back-etching with HF which results in a marked increase in the service life of the wafer boats and also the availability of the PECVD plant.

Further advantages are that the previously required pre-covering of the PECVD boat with silicon nitride and wafers required therefor are no longer necessary.

Furthermore, the PECVD boats and the retaining pins in particular are subject to reduced wear on account of the markedly greater hardness of the hard-material coating according to the invention compared to the hitherto customary coating with silicon nitride.

The resulting cost savings during operation of a PECVD plant may run into seven figures.

Finally, the hard-material coating according to the invention with titanium nitride, titanium carbide or boron carbide on the PECVD boat may be effected in the same PECVD plant in which for example application of the antireflective coating to the wafers also takes place.

Depending on the materials used for the hard-material coating on the PECVD boats, titanium nitride, titanium carbide or boron carbide, the steps to be implemented in the PECVD plant are slightly different.

It is first necessary to introduce into the PECVD plant either new PECVD boats or PECVD boats which have previously been used for producing antireflective coatings and have been etched back.

It is subsequently necessary for the production of a titanium nitride coating to heat the PECVD plant to about 500° C. and to evacuate it. After introduction of for example an organic titanium compound with a carrier gas and admixing of $NH_3$ as reductant the plasma necessary for producing the hard-material coating can be ignited.

The duration of this procedure depends on the thickness of the hard-material coating to be produced and on the number of layers to be applied.

By contrast the production of a hard-material coating made of boron carbide ($B_4C$) is somewhat simpler because this requires neither a vacuum nor a plasma.

The coating of the PECVD boats may be undertaken in a PECVD plant or at atmospheric pressure in a suitable oven in which the PECVD boats are initially heated to a temperature of about 1000° C. Carbon and boron are then introduced into the oven from suitable sources, a reaction to afford boron carbide then taking place on the surface of the PECVD boats.

The production of a titanium carbide coating may be effected via a customary CVD process.

If coating was undertaken in a PECVD plant, cleaning of the vacuum/reaction chamber should be undertaken after removal of the PECVD boats and this may be effected for example by introduction of hydrofluoric acid.

The invention claimed is:

1. A PECVD boat composed of graphite and devoid of a silicon nitride covering for receiving and transporting a plurality of wafers in or through a PECVD coating plant, the PECVD boat including retaining means for holding individual wafers of said plurality spaced apart to facilitate a uniform flow of gases through all interspaces between the individual wafers during a PECVD coating process, wherein the PECVD boat has an electrically conductive hard-material coating which comprises at least boron carbide ($B_4C$) to ensure formation of a uniform plasma between the wafers during the PECVD coating procedure.

2. The PECVD boat as claimed in claim 1, wherein thickness of the hard-material coating is between 0.1 μm and 5 μm.

3. The PECVD boat as claimed claim 1, wherein the hard-material coating comprises a combination of titanium nitride and boron carbide.

4. The PECVD boat as claimed in claim 1, wherein the hard-material coating comprises a combination of titanium nitride, titanium carbide and boron carbide.

5. The PECVD boat as claimed in claim 1, wherein the hard-material coating has a multilayer construction comprising boron carbide and at least one of titanium carbide and titanium nitride.

6. The PECVD boat as claimed in claim 1, wherein the retaining means comprises at least one of wafer pockets or retaining pins.

7. A PECVD boat composed of graphite and devoid of a silicon nitride covering for receiving and transporting a plurality of substrates in or through a PECVD coating plant to have an antireflective layer applied to the substrates in a PECVD coating procedure, the PECVD boat including retaining means for holding individual substrates of said plurality spaced apart to facilitate a uniform flow of gases through all interspaces between the individual substrates during the PECVD coating procedure, wherein the PECVD boat has an electrically conductive hard-material coating which comprises at least boron carbide ($B_4C$) to ensure formation of a uniform plasma between the substrates during the PECVD coating procedure and to ensure homogeneity of the antireflective layer applied to the substrates during the PECVD coating procedure.

* * * * *